United States Patent
Cheng

(10) Patent No.: US 10,120,499 B2
(45) Date of Patent: Nov. 6, 2018

(54) CAPACITANCE DETECTION METHOD AND DEVICE BASED ON CAPACITIVE TOUCH CONTROLLER CHIP

(71) Applicant: SHENZHEN GOODIX TECHNOLOGY CO., LTD., Shenzhen (CN)

(72) Inventor: Jian Cheng, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/641,800

(22) Filed: Jul. 5, 2017

(65) Prior Publication Data

US 2017/0300171 A1 Oct. 19, 2017

Related U.S. Application Data

(63) Continuation of application No. PCT/CN2016/087616, filed on Jun. 29, 2016.

(30) Foreign Application Priority Data

Feb. 22, 2016 (CN) .......................... 2016 1 0097255

(51) Int. Cl.
G06F 3/041 (2006.01)
G01R 27/26 (2006.01)
G06F 3/044 (2006.01)

(52) U.S. Cl.
CPC ........... *G06F 3/0416* (2013.01); *G01R 27/26* (2013.01); *G06F 3/044* (2013.01)

(58) Field of Classification Search
CPC .......... G06F 3/041; G06F 3/045; G06F 3/038; G01R 27/26; G09G 5/00
See application file for complete search history.

(56) References Cited

U.S. PATENT DOCUMENTS 8,884,917 B2 * 11/2014 Seo ...................... G06F 1/3262
345/174
9,110,547 B1 8/2015 Sivertsen
(Continued)

FOREIGN PATENT DOCUMENTS

CN 1797308 A 7/2006
CN 102411461 A 4/2012
(Continued)

OTHER PUBLICATIONS

International Search Report for International Application No. PCT/CN2016/087616, Applicant: Shenzhen Goodix Technology Co., Ltd., dated Nov. 18, 2016, 5 pages.

*Primary Examiner* — Pegeman Karimi

(57) ABSTRACT

A capacitance detection method based on a capacitive touch controller chip includes: setting configuration information of a plurality of detection channels, the configuration information includes information of activating sequence and pre-configuration information of a plurality of respective detection channels (201); pre-configuring the plurality of respective channels before detection in accordance with the pre-configuration information (202); activating a first detection channel in accordance with the information of activating sequence, and detecting a capacitance value generated by touch of a user in the currently activated channel (203); and activating a next channel in accordance with the information of activating sequence, and continuing to perform detection on a capacitance value of the next channel until completing the detection of capacitance values of all detection channels (204). The method can enhance the flexibility of setting detection channels.

14 Claims, 6 Drawing Sheets

(56) References Cited

U.S. PATENT DOCUMENTS

| | | | |
|---|---|---|---|
| 9,146,643 B2* | 9/2015 | Hong | G06F 3/0416 |
| 2011/0261007 A1* | 10/2011 | Joharapurkar | G06F 3/0418 |
| | | | 345/174 |
| 2012/0062464 A1 | 3/2012 | Otagaki et al. | |
| 2012/0169660 A1 | 7/2012 | Seo | |
| 2012/0268416 A1 | 10/2012 | Pirogov et al. | |
| 2013/0127774 A1 | 5/2013 | Hong et al. | |
| 2014/0218333 A1* | 8/2014 | Wang | G06F 3/044 |
| | | | 345/174 |

FOREIGN PATENT DOCUMENTS

| | | |
|---|---|---|
| CN | 102681715 A | 9/2012 |
| CN | 103207718 A | 7/2013 |

* cited by examiner

CAPACITANCE DETECTION METHOD AND DEVICE BASED ON CAPACITIVE TOUCH CONTROLLER CHIP

The present application is a continuation of international application No. PCT/CN2016/087616, filed on Jun. 29, 2016, which claims priority to Chinese Patent Application No. 201610097255.3, filed on Feb. 22, 2016, entitled "Capacitance Detection Method and Device Based on Capacitive Touch Controller Chip", both of which are hereby incorporated by reference in their entireties.

TECHNICAL FIELD

The present disclosure relates to the technical field of electronic circuits, and in particular, to a capacitance detection method and device based on a capacitive touch controller chip.

BACKGROUND

With the diversification of the type, size and application of a touch panel such as cell phone, pad, notebook, wearable device, television and interactive workbench, a single capacitance detection method becomes difficult to meet such diversified demands. If a specific design is proposed for every demand in response to the diversified demands, it is not beneficial to reduce costs in design and production, and meanwhile, a brand new design may also bring out the risk in design.

In the related art, a capacitance detection method generally adopted in a touch controller chip is: activating a channel of a capacitor to be detected; since a voltage is generated between a fixed capacitance and the capacitance of fingers to earth (that is, a ground capacitor in the channel by means of fingers based on earth), performing charging and discharging on the capacitor, thereby maximally accumulating effective charges of the capacitor from the fingers to earth and forming a capacitance voltage; and obtaining a capacitance detection value by processing the capacitance voltage.

However, capacitive touch screens are different in size and application scenario, the number and position of corresponding channels in the horizontal and the vertical direction, or the time of charging or discharging and capacitance detecting may be different, and the number of corresponding detection channels and configuration conditions may be also different, and therefore, the foregoing related art cannot meet the diversified demands for the number of channels, configuration condition and detection method generated from the distinction of the size and application scenario of the screens, thereby having poor adaptation, which may result in low capacitance detection efficiency.

SUMMARY

The present disclosure provides a capacitance detection method and device based on a capacitive touch controller chip, used for setting pre-configuration information of a detection channel and information of activating sequence of a plurality of detection channels in advance, configuring for the plurality of detection channels in accordance with the pre-configuration information and the information of activating sequence, and detecting a capacitance value, thereby enhancing the flexibility of setting a detection channel, improving the detection efficiency, and reducing detection costs.

The present disclosure provides a capacitance detection method based on a capacitive touch controller chip, used for detecting a capacitance value of a plurality of detection channels, comprising: setting configuration information of the plurality of detection channels, the configuration information of the plurality of detection channels containing information of activating sequence of a plurality of respective detection channels and pre-configuration information of the plurality of respective detection channels; pre-configuring the plurality of respective detection channels before detection in accordance with the pre-configuration information of the plurality of respective detection channels; activating the first detection channel in accordance with the information of activating sequence of the plurality of respective detection channels, and detecting a capacitance value generated by touch of a user in the currently activated detection channel; and activating a next detection channel in accordance with the information of activating sequence, when the capacitance value of the currently activated detection channel is completed, and continuing to perform detection on a capacitance value of the next detection channel until completing the detection of capacitance values of all detection channels.

The present disclosure provides a capacitance detection device based on a capacitive touch controller chip, used for detecting a capacitance value of a plurality of detection channels, comprising: a setting module, configured to set configuration information of the plurality of detection channels, the configuration information of the plurality of detection channels containing information of activating sequence of the plurality of respective detection channels and pre-configuration information of the plurality of respective detection channels; a configuration module, configured to pre-configure the plurality of respective detection channels before detection in accordance with the pre-configuration information of the plurality of respective detection channels; an activating module, configured to activate the first detection channel in accordance with the information of activating sequence of the plurality of respective detection channels; a detection module, configured to detect a capacitance value generated by touch of a user in the currently activated detection channel; the activating module, further configured to activate a next detection channel in accordance with the information of activating sequence when the capacitance value of the currently activated detection channel is completed; and the detection module, further configured to continue to perform detection on a capacitance value of the next detection channel.

It can be seen from the above-mentioned embodiments of the present disclosure that the present disclosure provides a capacitance detection method and device based on a capacitive touch controller chip, comprising: setting information of activating sequence and pre-configuration information of a plurality of respective detection channels in advance to detect a chip capacitor, configuring for a plurality of detection channels in accordance with the pre-configuration information, activating the plurality of respective detection channels in accordance with the information of activating sequence, and detecting a capacitance value of the currently activated detection channel, thereby enhancing the flexibility of setting a detection channel, improving the detection efficiency, and reducing detection costs by setting a detection channel according to detection requirements.

BRIEF DESCRIPTION OF DRAWINGS

To describe the technical solutions in the embodiments of the present disclosure or the related art more clearly, the following briefly describes the accompanying drawings required for describing the embodiments of the present disclosure or the related art. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, features, and advantages of the present disclosure more apparent and understandable, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

Figure 1:
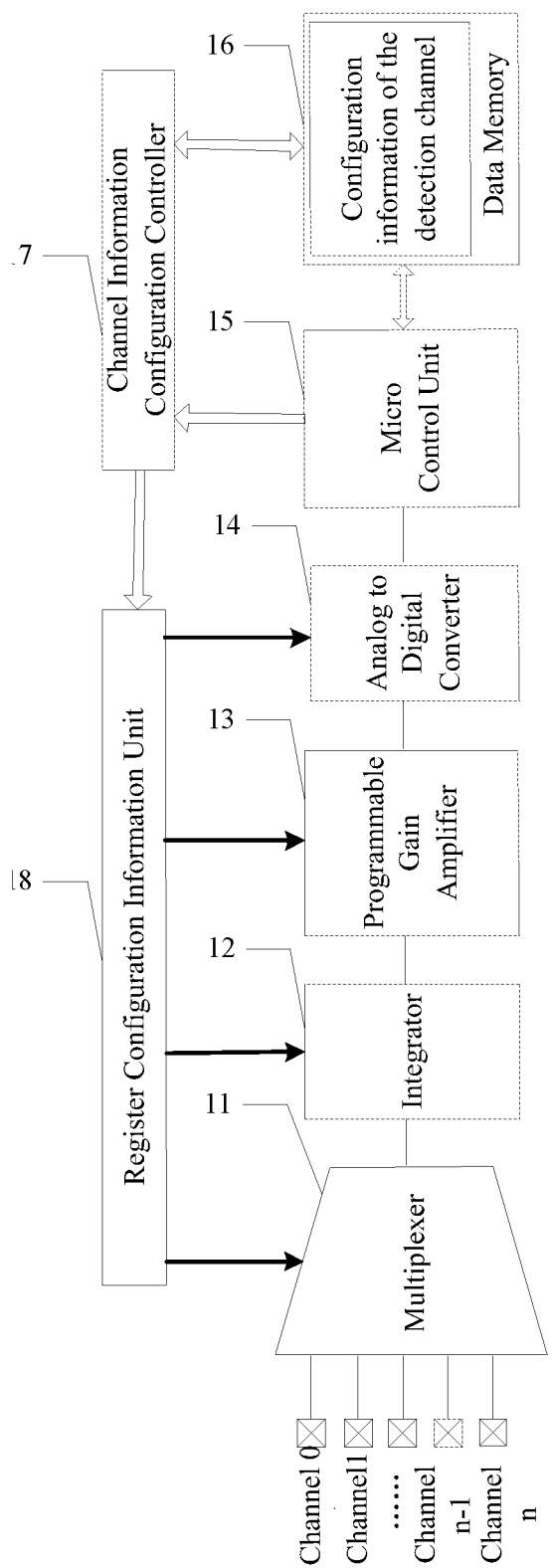
FIG. 1 is a schematic diagram of a circuit in a capacitance detection method based on a capacitive touch controller chip according to an embodiment of the present disclosure.

FIG. 1 is a schematic diagram of a circuit in a capacitance detection method based on a capacitive touch controller chip according to an embodiment of the present disclosure. The circuit includes: a multiplexer 11, an integrator 12, a programmable gain amplifier 13, an analog to digital converter 14, a micro control unit 15, a data memory 16, a channel information configuration controller 17 and a register configuration information unit 18.

The multiplexer (multiplexer, MUX) 11 is configured to select a designated capacitive detection channel.

The integrator (Integrator) 12 is configured to accumulate a voltage of the corresponding detection channel generated by touch of a user.

The programmable gain amplifier (PGA, Programmable Gain Amplifier) 13 is configured to amplify the weak voltage value accumulated by the integrator.

The analog to digital converter (ADC, Analog to Digital Converter) 14 is configured to convert an analog voltage to a digital signal.

The micro control unit (Micro Control Unit, MCU) 15 is configured to define the first detection channel, and further to initiate a capacitance detection process, activate the channel information configuration controller 17, and to process the converted digital signal data by the ADC.

Further, after activating the channel information configuration controller 17, the MCU can go to sleep. After this capacitance detection process is finished, the MCU can be awakened by way of interrupt. And putting the MCU to sleep may reduce the whole power consumption of a system.

The data memory (Data Memory) 16 is configured to store data including configuration information of a plurality of detection channels.

The channel information configuration controller 17 is configured to read the configuration information of the plurality of detection channels from the data memory 16, write content of the configuration information of the plurality of detection channels in the register configuration information unit 18, and activate the plurality of detection channels after completing pre-configuration of the plurality of detection channels in the register configuration information unit 18 in accordance with pre-configuration information in the configuration information. The pre-configuration of the plurality of detection channels refers to necessary pre-configuration of related circuits and electronic elements for detecting the plurality of detection channels before activating the plurality of detection channels and completing the detection of a capacitance value of the plurality of detection channels, for example, configuring the integrator, the programmable gain amplifier and the analog to digital converter corresponding to detecting the capacitance value for a plurality of respective detection channels, so as to complete the detection of the capacitance value of the activated detection channel.

Specifically, the channel information configuration controller 17 finds the first detection channel, i.e., a start channel for detection, from the configuration information of the plurality of detection channels, reads pre-configuration information corresponding to the start channel, and reads a description value of a next detection channel. The description value is configured to identify the detection state of the plurality of detection channels, for example, the description value may use "1" to identify that the detection of one detection channel has been completed, and use "0" to identify that the detection of one detection channel has not been completed. Since the activating and the detection of the plurality of detection channels have continuity, it represents that all detection channels in this round have been detected when the description value of one detection channel is 1. If the read description value represents that detection of this round has been completed and there is no next detection channel, the capacitance detection process is stopped after completing the capacitance detection of the current detection channel until the MCU 14 initiates detection of a capacitance value of a detection channel in the next round.

The register configuration information unit 18 is configured to pre-configure the integrator, the programmable gain amplifier and the analog to digital converter corresponding thereto for the plurality of respective detection channels respectively before performing detection on the capacitance value, in accordance with the pre-configuration information of the plurality of respective detection channels in the configuration information of the plurality of detection channels written by the channel information configuration controller 17.

Figure 2:
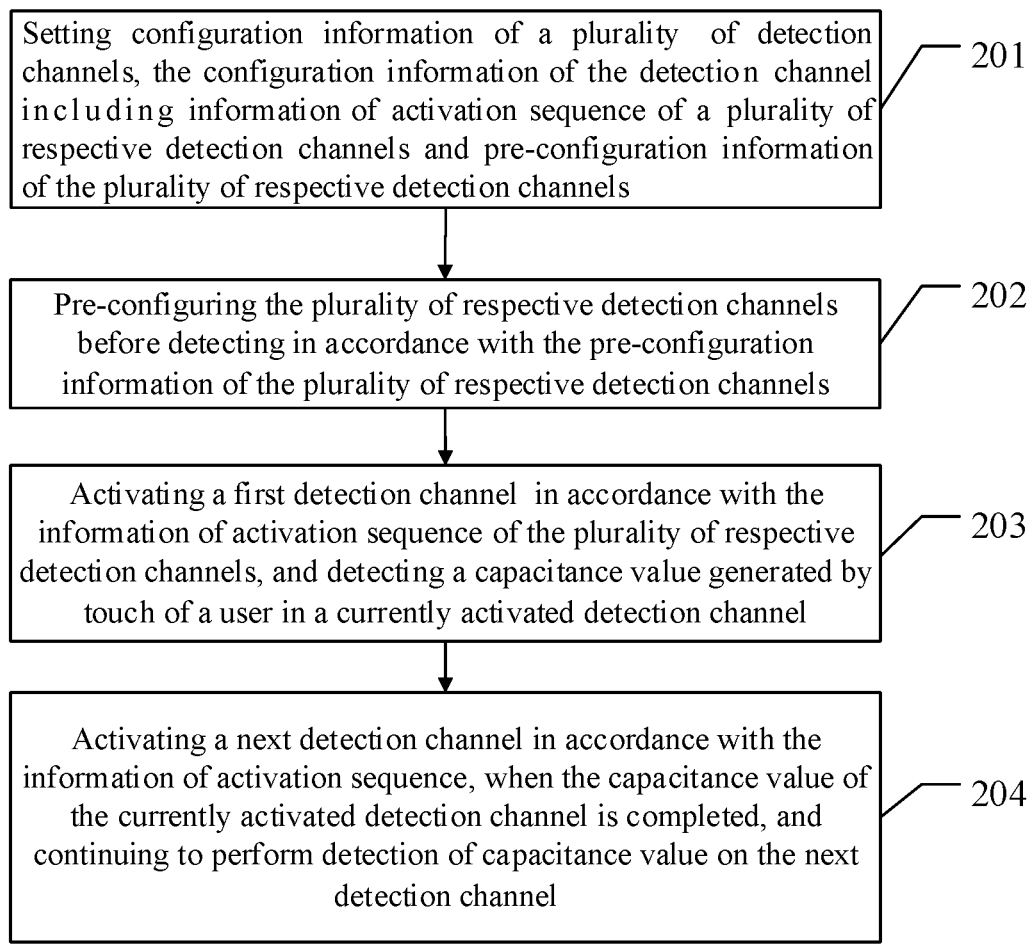
FIG. 2 is a schematic flowchart of a capacitance detection method based on a capacitive touch controller chip according to a first embodiment of the present disclosure.

The following describes a capacitance detection method based on a capacitive touch controller chip in an embodiment of the present disclosure in details, which can be used for detecting a capacitance value of a detection channel. Referring to FIG. 2, FIG. 2 is a schematic flowchart of an implementation of a capacitance detection method based on a capacitive touch controller chip according to a first embodiment of the present disclosure. The method includes steps as follows:

201. Setting configuration information of a plurality of detection channels, the configuration information of the plurality of detection channels containing information of activating sequence of a plurality of respective detection channels and pre-configuration information of the plurality of respective detection channels;

When a finger contacts the capacitive touch controller chip, a voltage is generated and a capacitance value of the contact point is caused to change. When the capacitance value of the capacitive touch controller chip is detected, it is required to activate the plurality of respective detection channels one by one according to a certain sequence, and detect and record a capacitance value generated by a finger contact in the currently activated detection channel.

In the embodiment, the configuration information of the plurality of detection channels can be set according to detection requirements, where the configuration information contains information of activating sequence and pre-configuration information of the plurality of respective detection channels for detecting the capacitance value.

The pre-configuration information refers to information about pre-configuring the plurality of detection channels before activating the plurality of detection channels and completing the detection of the capacitance value of the activated detection channel, which includes necessary pre-configuration information of related circuits and electronic elements of the plurality of detection channels, for example, configuring relevant information of an integrator, a programmable gain amplifier and an analog to digital converter corresponding to detecting the capacitance value for the respective detection channels. That is, the detection of the capacitance value can be completed after pre-configuring the plurality of respective detection channels in accordance with the pre-configuration information.

Further, the configuration information of the plurality of detection channels contains information of activating sequence of a plurality of respective detection channels, representing the activating sequence of the plurality of detection channels. The plurality of detection channels is activated one by one in accordance with the information of activating sequence, where one detection channel is activated each time, and then a next detection channel is continued to activated in accordance with the information of activating sequence to detect a capacitance value after completing the detection of the capacitance value of the currently activated detection channel.

When the activating sequence is set, it is required to set the number of activated detection channels, and it may set the activating sequence of the plurality of respective detection channels on the basis of setting the number of the plurality of detection channels. Specifically, when the number of the plurality of detection channels of the capacitive touch controller chip is set, it may be set as being smaller than the maximum number of detection channel that the capacitive touch controller chip can support. For example, when the capacitive touch controller chip supports 7×7 number of detection channels to the maximum, it is possible to flexibly set 6×6, 7×5 or 5×5 number of detection channels to detect the capacitance value of the capacitive touch controller chip in a manner of setting the configuration information of the plurality of detection channels without activating the whole 7×7 number of detection channels, thereby saving the configuration time of detection and actual detection time, and saving detection costs.

202. Pre-configuring the plurality of respective detection channels before detection in accordance with the pre-configuration information of the plurality of respective detection channels;

The plurality of respective detection channels is pre-configured before detection in accordance with the pre-configuration information of the plurality of respective detection channels in the configuration information of the plurality of detection channels, that is, some necessary configuration before detection are performed on the plurality of respective detection channels so that the detection of the capacitance value of the plurality of respective detection channels can be completed.

203. Activating the first detection channel in accordance with the information of activating sequence of the plurality of respective detection channels, and detecting a capacitance value generated by touch of a user in the currently activated detection channel;

In the information of activating sequence of the plurality of respective detection channels, a start channel of which the capacitance value is to be detected is set, and the start channel is thus the first detection channel. When detection is performed, the first detection channel is activated in accordance with the activating sequence of the plurality of respective detection channels. And when the finger of the user touches the activated channel, the capacitance value of the channel changes, and is detected and recorded at this time.

204. Activating a next detection channel in accordance with the information of activating sequence, when the detection of the capacitance value of the currently activated detection channel is completed, and continuing to perform detection on a capacitance value of the next detection channel until completing the detection of capacitance values of all detection channels.

After the detection of the capacitance value of the currently activated detection channel is completed, a next detection channel is activated in accordance with the information of activating sequence of the plurality of respective detection channels, and detection of a capacitance value of the next detection channel is continued to be performed, that is, performing the same capacitance detection process as the step 203 in the next detection channel once again. Similarly, each of the plurality of detection channels is activated one by one for detection of the capacitance value in accordance with the information of activating sequence until the detection of capacitance values of all detection channels is completed.

In the embodiment of the present disclosure, the configuration information of the plurality of detection channels is set in advance to detect a chip capacitor, and when detecting the capacitance value, a detection channel is activated in accordance with the information of activating sequence of the plurality of respective detection channels in the configuration information, and the capacitance value of the currently activated detection channel is detected, thereby enhancing the flexibility of setting a detection channel, improving the detection efficiency, and reducing detection costs by setting detection channels according to detection requirements.

Figure 3:
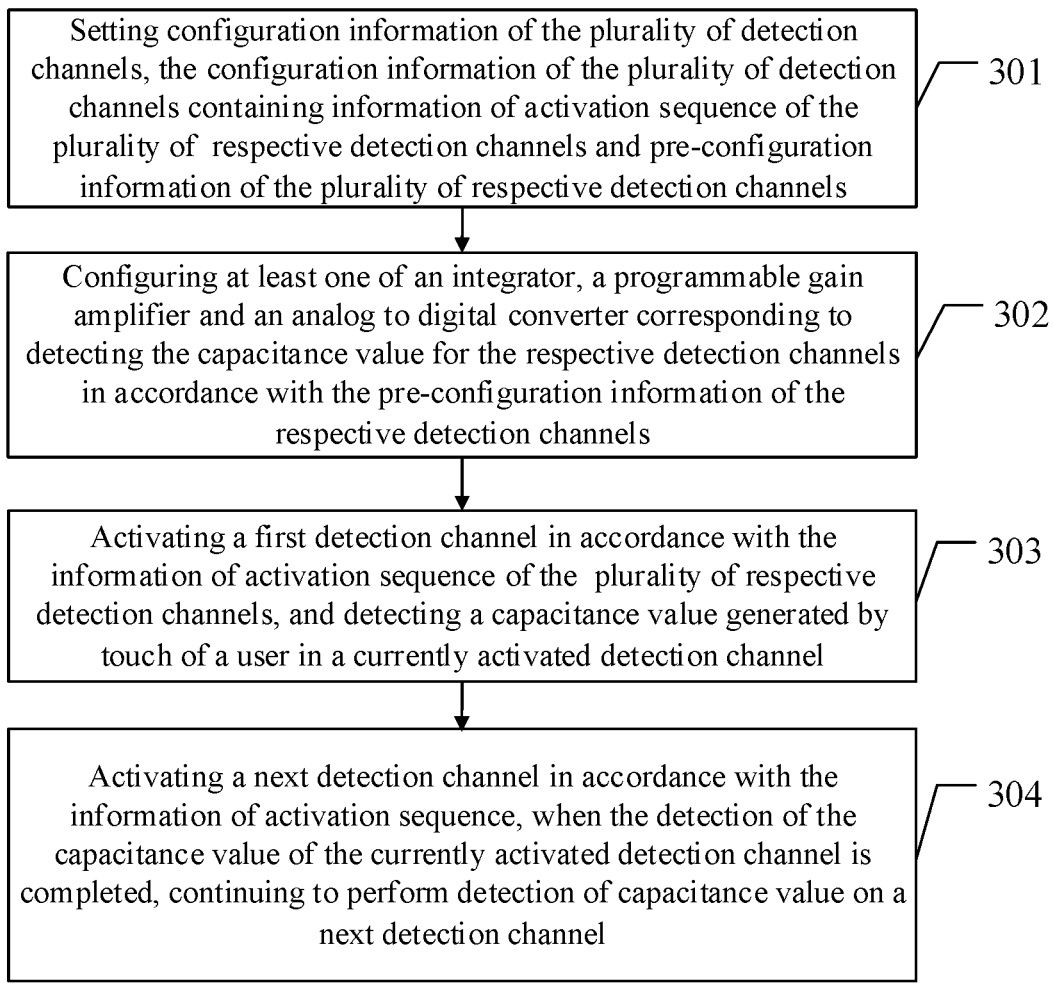
FIG. 3 is a schematic flowchart of a capacitance detection method based on a capacitive touch controller chip according to a second embodiment of the present disclosure.

Referring to FIG. 3, FIG. 3 is a schematic flowchart of an implementation of a capacitance detection method based on a capacitive touch controller chip according to a second embodiment of the present disclosure, where the method includes steps as follows:

301. Setting configuration information of a plurality of detection channels, the configuration information of the plurality of detection channels containing information of activating sequence of a plurality of respective detection channels and pre-configuration information of the plurality of respective detection channels;

The setting configuration information of the plurality of detection channels can be specifically: setting a configuration table of the plurality of detection channels in a form of a linked list. The linked list type configuration table of the plurality of detection channels contains the information of activating sequence of the plurality of respective detection channels and the pre-configuration information of the plurality of respective detection channels. The linked list is a discontinuous and non-sequenced memory structure in a physical memory unit, and the logical sequence of data elements is realized by the link sequence of a pointer in the linked list.

Figure 4:
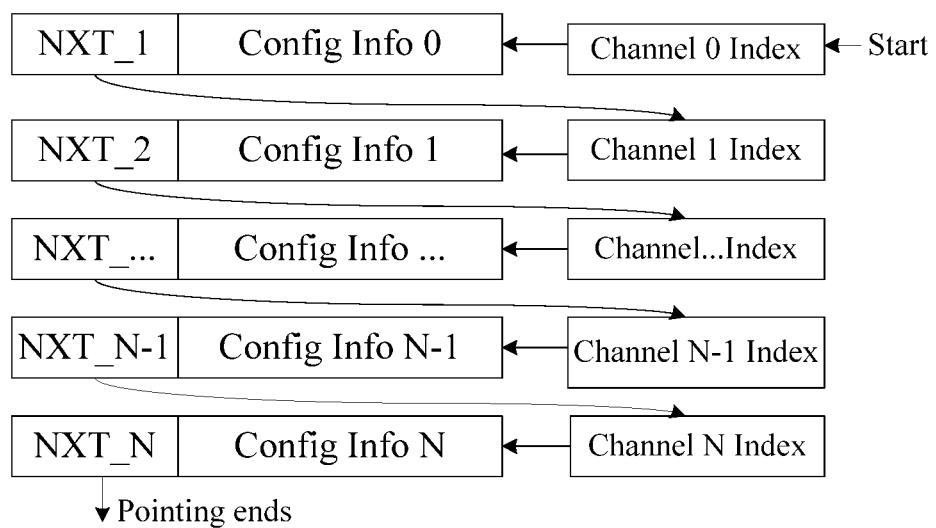
FIG. 4 is a schematic diagram of a format of a linked list type configuration table of a detection channel according to one embodiment of the present disclosure.

Refer to FIG. 4 for a specific schematic format diagram of a linked list type configuration table of a plurality of detection channels. The of linked list type configuration table of the plurality of detection channels includes: a pointer and an index value of the respective detection channels; and at this time, the information of activating sequence of the plurality of respective detection channels is a sequence formed by a pointing relationship in which the pointer of each detection channel points to the index value of another detection channel. Specifically, the index value of a plurality of respective detection channels forms the pointing relationship with the pointer of the previous detection channel by the pointer of the plurality of respective detection channels pointing to the index value of another detection channel, and the pointing relationship between the pointer and the index value forms the activating sequence of the plurality of respective detection channels. Particularly, the index value in the first activated detection channel in the configuration information of the plurality of detection channels indicates that the first activated detection channel is a start channel in which a capacitance value is detected, and there is no a corresponding pointer for the index value of the start channel; and when the pointer of the last detection channel in the detection of this round points to end, it indicates that the last detection channel is an end channel in which a capacitance value is detected in this round.

In FIG. 4, NXT_1~NXT_N represent pointers, N represents the number of the plurality of detection channels; channel 0 Index~channel N Index represent index values; and Config Info 0~Config Info N represent pre-configuration information corresponding to the plurality of respective detection channels. Since it is only required to ensure that the pointing position Index of the pointer is correct when the next detection channel required to be activated is pointed in the form of a pointer, without storing the configuration information of the plurality of respective detection channels consecutively, the configuration information can be dispersedly stored in the data memory flexibly, thereby completing the extension of setting the plurality of detection channels flexibly, conveniently and effectively, and making no limitation to a memory address of the data memory.

Figure 5:
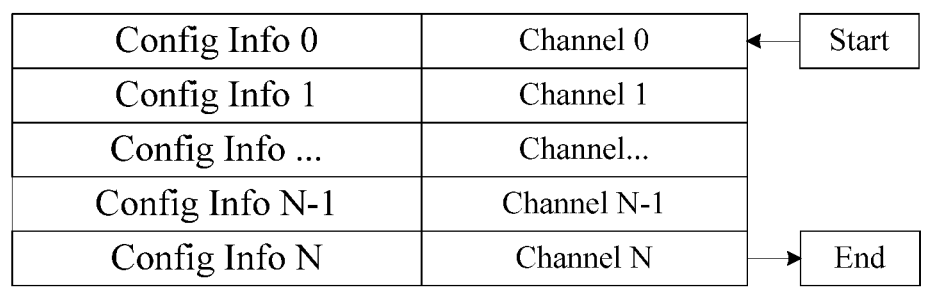
FIG. 5 is a schematic diagram of a format of an array type configuration table of a detection channel according to another embodiment of the present disclosure.

Alternatively, the setting configuration information of the plurality of detection channels can be specifically: setting a configuration table of the plurality of detection channels in a form of an array type. The configuration table of the plurality of detection channels of the array type contains the information of activating sequence of the plurality of respective detection channels and the pre-configuration information of the plurality of respective detection channels. Refer to FIG. 5 for a specific format of the configuration table of the plurality of detection channels. In the configuration table of the plurality of detection channels, N represents the number of the plurality of detection channels; Config Info 0~Config Info N represent pre-configuration information corresponding to the plurality of respective detection channels; and the first activated detection channel and the last detection channel are illustrated. The information of activating sequence of the plurality of respective detection channels is an arrangement sequence of the plurality of respective detection channels in the configuration table of the plurality of detection channels of the array type, that is, the corresponding detection channel is activated in sequence in accordance with the arrangement sequence of the plurality of respective detection channels from top to bottom in the configuration table of the plurality of detection channels of the array type.

Since it is only required to perform addition or deletion in accordance with the number of the plurality of detection channels in the end of the configuration table of the plurality of detection channels in accordance with an established format in the table when the setting of adding or deleting the plurality of detection channels is needed, it is convenient to change the configuration of the number of the plurality of detection channels, and increase the flexibility of setting the plurality of detection channels. And the configuration table of the plurality of detection channels of the array type can be achieved by multiplexing the data memory, and thus the addition or deletion of the number of the plurality of detection channels does not place an impact on the entire structure of the configuration table of the plurality of detection channels of the array type.

Further, the configuration information of the plurality of detection channels indicates activating sequence of the plurality of respective detection channels in a certain format. The plurality of detection channels is activated one by one in accordance with the activating sequence, where one detection channel is activated each time, and then a next detection channel is activated in accordance with the activating sequence to perform detection after the detection of the capacitance value of the currently activated detection channel is completed.

302. Configuring at least one of an integrator, a programmable gain amplifier and an analog to digital converter corresponding to detecting the capacitance value for the plurality of respective detection channels in accordance with the pre-configuration information of the plurality of respective detection channels;

The Integrator, the PGA and the ADC corresponding to detecting the capacitance value of the plurality of respective detection channels are configured in accordance with the pre-configuration information, where the Integrator is configured to collect a voltage caused by a finger touch when the finger touch exists in the activated detection channel of the chip to be detected; the PGA is configured to amplify the value of the voltage, and the ADC is configured to convert a voltage analog signal to a digital signal, and output the digital signal to the MCU for processing, thereby obtaining the detected capacitance value of the current detection channel.

303. Activating the first detection channel in accordance with the information of activating sequence of the plurality of respective detection channels, and detecting a capacitance value generated by touch of a user in the currently activated detection channel;

In the configuration information of the plurality of detection channels, the first detection channel which is to be activated is set. When the capacitance value is detected, the first detection channel is activated in accordance with the set activating sequence of the plurality of respective detection channels; and in the plurality of detection channels, when the finger of the user touches the plurality of detection channels, the capacitance value changes, and is detected and recorded through the Integrator, the PGA and the ADC configured for the first detection channel in the step 303.

The specific method of activating the first detection channel is: applying a voltage to and charging the first detection channel so as to activate the first detection channel in the manner of in the manner of externally applied voltage.

304. Activating a next detection channel in accordance with the information of activating sequence, when the detection of the capacitance value of the currently activated detection channel is completed, and continuing to perform detection on a capacitance value of the next detection channel until completing the detection of capacitance values of all detection channels.

After the detection of the capacitance value of the currently activated detection channel is completed, the next detection channel is activated in accordance with the information of activating sequence of the plurality of respective detection channels in the configuration information of the plurality of detection channels, and detection of the capacitance value of the next detection channel is continued to be performed, that is, performing the same capacitance detection process as the step 304 in the next detection channel once again. By that analogy, each of the plurality of detection channels is activated one by one for detection in accordance with the information of activating sequence until the detection of capacitance values of all detection channels is completed.

In the embodiment of the present disclosure, the pre-configuration information of the plurality of detection channels and the information of activating sequence of the plurality of respective detection channels are pre-configured to detect the chip capacitor, and when the capacitance is detected, the plurality of detection channels is activated in accordance with the information of activating sequence, and the capacitance value of the currently activated detection channel is detected, thereby enhancing the flexibility of setting a detection channel, improving the detection efficiency, and reducing detection costs by setting a detection channel according to detection requirements.

Figure 6:
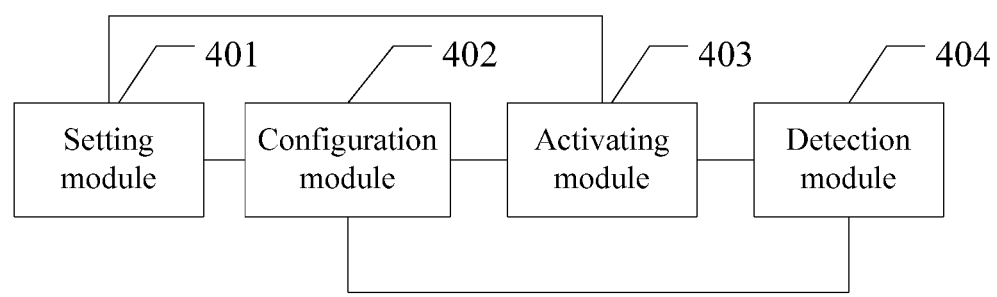
FIG. 6 is a schematic diagram of a capacitance detection device based on a capacitive touch controller chip according to a third and a fourth embodiments of the present disclosure.

Referring to FIG. 6, FIG. 6 is a schematic structural diagram of a capacitance detection device based on a capacitive touch controller chip provided by a third embodiment of the present disclosure. To facilitate the illustration, the related parts of the embodiment of the present disclosure are merely illustrated. The capacitance detection device based on the capacitive touch controller chip exemplified in FIG. 6 is used for detecting a capacitance value of a detection channel, and the device can be an executive body of the capacitance detection method based on the capacitive touch controller chip provided by the embodiments illustrated in the foregoing FIGS. 4 and 5. The device includes: a setting module 401, a configuration module 402, an activating module 403 and a detection module 404.

The above functional modules are described in details as follows:

where the setting module 401 is configured to set configuration information of a plurality of detection channels, and the configuration information of the plurality of detection channels contains information of activating sequence of a plurality of respective detection channels and pre-configuration information of the plurality of respective detection channels;

the configuration module 402 is configured to pre-configure the plurality of respective detection channels before detection in accordance with the pre-configuration information of the plurality of respective detection channels;

the activating module 403 is configured to activate the first detection channel in accordance with the information of activating sequence of the plurality of respective detection channels;

the detection module 404 is configured to detect a capacitance value generated by touch of a user in the currently activated detection channel;

the activating module 403 is further configured to activate a next detection channel in accordance with the information of activating sequence when the capacitance value of the currently activated detection channel is completed; and the detection module 404 is further configured to continue to perform detection on a capacitance value of the next detection channel.

The details not involved in the embodiment can refer to the description of the embodiments illustrated in the foregoing FIGS. 2 and 3, and details are not described herein again.

It should be noted that in the embodiment of the capacitance detection device based on the capacitive touch controller chip exemplified in FIG. 6, the division of the functional modules is merely illustration with examples; in the actual application, the above functions can be allocated to different functional modules according to requirements such as convenience of configuration requirements of corresponding hardware or software implementation, that is, the internal structure of the capacitance detection device based on the capacitive touch controller chip is divided into different functional modules so as to complete the above described whole or part of functions. Moreover, in the actual application, the corresponding functional modules in the embodiment can be realized by the corresponding hardware, and can also be completed by the corresponding hardware executing the corresponding software. All of the embodiments provided in the present disclosure can be applied to the above described rule, and details are not described in the following again.

In the embodiment of the present disclosure, the configuration information of the plurality of detection channels is pre-configured to detect a chip capacitor, and when the capacitance is detected, the plurality of detection channels is activated in accordance with the information of activating sequence in the configuration information, and the capacitance value of the currently activated detection channel is detected, thereby enhancing the flexibility of setting a detection channel, improving the detection efficiency, and reducing detection costs by setting a detection channel according to detection requirements.

Still referring to FIG. 6, the structure of a capacitance detection device based on a capacitive touch controller chip provided by a fourth embodiment of the present disclosure differs from the structure of the capacitance detection device based on the capacitive touch controller chip provided by the foregoing third embodiment in:

further, the setting module 401 is further configured to set a configuration table of the plurality of detection channels in a form of a linked list type, and the configuration table of the plurality of detection channels of the linked list type contains the information of activating sequence of the respective detection channels and the pre-configuration information of the respective detection channels, where the configuration table of the plurality of detection channels of the linked list type includes: a pointer and an index value of the respective detection channels; and the information of activating sequence of the respective detection channels is a sequence formed by a pointing relationship in which the pointer of the respective detection channels points to the index value of another detection channel.

Further, the setting module 401 is further configured to set a configuration table of the plurality of detection channels in a form of an array type, the configuration table of the plurality of detection channels of the array type contains the information of activating sequence of the plurality of respective detection channels and the pre-configuration information of the plurality of respective detection channels, where the information of activating sequence of the respective detection channels is an arrangement sequence of the plurality of respective detection channels in the configuration table of the plurality of detection channels of the array type.

The configuration module 402 is configured to configure at least one of an integrator, a programmable gain amplifier and an analog to digital converter corresponding to detecting the capacitance value of the plurality of respective detection channels in accordance with the pre-configuration information.

The activating module 403 is further configured to apply a voltage to and charge the first detection channel so as to activate the first detection channel in the manner of externally applied voltage.

The details not involved in the embodiment can refer to the description of the foregoing embodiments illustrated, and details are not described herein again.

In the embodiment of the present disclosure, the configuration information of the plurality of detection channels is pre-configured to detect a chip capacitor, and when the capacitance is detected, the plurality of detection channels is activated in accordance with the information of activating sequence in the configuration information, and the capacitance value of the currently activated detection channel is detected, thereby enhancing the flexibility of setting a detection channel, improving the detection efficiency, and reducing detection costs by setting a detection channel according to detection requirements.

In the several embodiments provided in the present application, it should be understood that the disclosed system, device, and method may be implemented in other manners. For example, the described device embodiments are merely exemplary. For example, the module division is merely logical function division and may be other division in actual implementation. For example, a plurality of modules or components may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

The modules described as separate parts may or may not be physically separate, and parts displayed as modules may or may not be physical modules, may be located in one position, or may be distributed on a plurality of network modules. A part or all of the modules may be selected according to actual requirements to achieve the objectives of the solutions of the embodiments of the present disclosure.

In addition, functional modules in the embodiments of the present disclosure may be integrated into one processing module, or each of the modules may exist alone physically, or two or more modules are integrated into one module. The integrated module may be implemented in a form of hardware, or may be implemented in a form of a software functional module.

When the integrated module is implemented in the form of a software functional module and sold or used as an independent product, the integrated module may be stored in a computer-readable storage medium. Based on such an understanding, the technical solutions of the present disclosure essentially, or the part contributing to the related art, or all or a part of the technical solutions may be implemented in the form of a software product. The computer software product is stored in a storage medium and includes several instructions for instructing a computer device (which may be a personal computer, a server, a network device, or the like) to perform all or a part of the steps of the methods described in the embodiments of the present disclosure. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

It should be noted that the foregoing method embodiments are illustrated as a series of action combinations for the purpose of brief description. However, those skilled in the art shall know that the present disclosure is not limited to the illustrated sequence of actions, because some steps may be conducted in other sequence or at the same time in accordance with the present disclosure. In addition, those skilled in the art shall also know that all of the illustrated embodiments in the description belong to preferred embodiments, and the related actions and modules therein are not necessarily included in the present disclosure.

In the above mentioned embodiments, illustration of the embodiments has its own focus, and parts without detailed illustration in a certain embodiment can refer to the relevant illustration of other embodiments.

The above is the description of a capacitance detection method and device based on a capacitive touch controller chip provided in the present disclosure. For those skilled in the art, there can be variations in terms of both the specific embodiments and application scope in accordance with the thought of the embodiments of the present disclosure. To sum up, the content of the description shall not be understood as limitation to the present disclosure.

What is claimed is:

1. A capacitance detection method based on a capacitive touch controller chip, used for detecting capacitance values of detection channels, wherein the method comprises:
   setting configuration information of the detection channels, the configuration information of the detection channels comprises information of activating sequence of respective detection channels and pre-configuration information of the respective detection channels;
   pre-configuring for the respective detection channels before detecting in accordance with the pre-configuration information of the respective detection channels;
   activating a first detection channel in accordance with the information of activating sequence of the respective detection channels, and detecting a capacitance value generated by touch of a user in a currently activated detection channel; and
   activating, when the capacitance value of the currently activated detection channel is completed, a next detection channel in accordance with the information of activating sequence, and continuing to perform detection on a capacitance value of the next detection channel.

2. The method according to claim 1, wherein the setting configuration information of the detection channels, the configuration information of the detection channels comprises information of activating sequence of the respective detection channels and pre-configuration information of the respective detection channels comprises:
    setting a configuration table of the detection channels, wherein the configuration table of the detection channels is in a form of a linked list type, and the configuration table of the detection channels comprises the information of activating sequence of the respective detection channels and the pre-configuration information of the respective detection channels.

3. The method according to claim 1, wherein the configuration table of the detection channels comprises: a pointer and an index value of the detection channel; and
    the information of activating sequence of the respective detection channels is a sequence formed by a pointing relationship in which the pointer of the detection channel points to the index value of another detection channel.

4. The method according to claim 1, wherein the setting configuration information of the detection channels, the configuration information of the detection channels comprises information of activating sequence of the respective detection channels and pre-configuration information of the respective detection channels comprises:
    setting a configuration table of the detection channels, wherein the configuration table of the detection channels is in a form of an array type, and the configuration table of the detection channels comprises the information of activating sequence of the respective detection channels and the pre-configuration information of the respective detection channels.

5. The method according to claim 4, wherein the information of activating sequence of the respective detection channels is an arrangement sequence of the respective detection channels in the configuration table of the detection channels.

6. The method according to claim 1, wherein pre-configuring the respective detection channels before detection in accordance with the pre-configuration information of the respective detection channels comprises:
    configuring an integrator, a programmable gain amplifier and/or an analog to digital converter corresponding to detecting the capacitance value for the respective detection channels in accordance with the pre-configuration information.

7. The method according to claim 1, wherein activating a first detection channel comprises:
    applying a voltage to and charging the first detection channel so as to activate the first detection channel in a manner of externally applied voltage.

8. A capacitance detection device based on a capacitive touch controller chip, used for detecting capacitance values of detection channels, wherein the device comprises:
    a processor; and
    a non-transitory memory having processor-executable instructions stored thereon that, when executed on the processor, cause the capacitance detection device to:
    set configuration information of the detection channels, the configuration information of the detection channels comprises information of activating sequence of the respective detection channels and pre-configuration information of the respective detection channels;
    pre-configure for the respective detection channels before detecting in accordance with the pre-configuration information of the respective detection channels;
    activate a first detection channel in accordance with the information of activating sequence of the respective detection channels;
    detect a capacitance value generated by touch of a user in the currently activated detection channel;
    activate a next detection channel in accordance with the information of activating sequence when the capacitance value of the currently activated detection channel is completed; and
    continue to perform detection of a capacitance value on the next detection channel.

9. The device according to claim 8, wherein the processor-executable instructions, when executed on the processor, cause the capacitance detection device to set a configuration table of the detection channels, wherein the configuration table of the detection channels is in a form of a linked list type, and the configuration table of the detection channels comprises the information of activating sequence of the respective detection channels and the pre-configuration information of the respective detection channels.

10. The device according to claim 8, wherein the configuration table of the detection channels comprises: a pointer and an index value of the detection channel; and
    the information of activating sequence of the respective detection channels is a sequence formed by a pointing relationship in which the pointer of the detection channel points to the index value of another detection channel.

11. The device according to claim 8, wherein the processor-executable instructions, when executed on the processor, cause the capacitance detection device to set a configuration table of the detection channels, wherein the configuration table of the detection channels is in a form of an array type, and the configuration table of the detection channels comprises the information of activating sequence of the respective detection channels and the pre-configuration information of the respective detection channels.

12. The device according to claim 11, wherein the information of activating sequence of the respective detection channels is an arrangement sequence of the respective detection channels in the configuration table of the detection channels.

13. The device according to claim 8, wherein the processor-executable instructions, when executed on the processor, cause the capacitance detection device to configure an integrator, a programmable gain amplifier and/or an analog to digital converter corresponding to detecting the capacitance value for the respective detection channels in accordance with the pre-configuration information.

14. The circuit according to claim 13, wherein the processor-executable instructions, when executed on the processor, cause the capacitance detection device to apply a voltage to and charge the first detection channel so as to activate the first detection channel in a manner of externally applied voltage.

* * * * *